United States Patent [19]
Nemoto et al.

[11] Patent Number: 5,777,865
[45] Date of Patent: Jul. 7, 1998

[54] POWER CONVERSION APPARATUS AND ITS CONTROLLING METHOD

[75] Inventors: Minehiro Nemoto; Hideki Miyazaki; Yoshitaka Sugawara, all of Hitachi, Japan

[73] Assignee: Hitachi, Ltd., Tokyo, Japan

[21] Appl. No.: 515,334

[22] Filed: Aug. 15, 1995

[30] Foreign Application Priority Data

Aug. 23, 1994 [JP] Japan ................... 6-198161

[51] Int. Cl.⁶ .................... H02M 3/335; H02M 3/24; H02M 7/00; H03K 17/687
[52] U.S. Cl. .................... 363/124; 363/17; 363/98; 327/434
[58] Field of Search ................. 363/17, 98, 132, 363/124; 323/222; 327/434, 479, 534, 535

[56] References Cited

U.S. PATENT DOCUMENTS

| | | | |
|---|---|---|---|
| 3,586,883 | 6/1971 | Hayes | 327/534 |
| 4,566,059 | 1/1986 | Gallios et al. | 363/17 |
| 4,649,321 | 3/1987 | Ferraro | 315/224 |
| 4,706,177 | 11/1987 | Josephson | 363/24 |
| 4,926,302 | 5/1990 | Harada et al. | 363/16 |
| 4,934,822 | 6/1990 | Higaki | 363/37 |
| 5,012,400 | 4/1991 | Yasuda | 363/95 |
| 5,313,143 | 5/1994 | Vila-Masot et al. | 315/209 R |
| 5,519,306 | 5/1996 | Itoh et al. | 323/222 |

*Primary Examiner*—Peter S. Wong
*Assistant Examiner*—Bao Q. Vu
*Attorney, Agent, or Firm*—Antonelli, Terry, Stout & Kraus, LLP

[57] ABSTRACT

A power conversion apparatus has a four terminal semiconductor device including a drain terminal and a source terminal for supplying main current, a gate terminal for controlling the main current, and a base terminal for controlling the on-state voltage, and energy storage means which is connected in the main current circuit consisting of a load and a main power source, wherein electric power is supplied to the base terminal of the semiconductor device by energy stored in the storage means.

Because electric power supplied to the base terminal is provided by energy from the main current circuit, the occurrence of power loss in the control circuit to achieve high frequency operation is avoided.

10 Claims, 8 Drawing Sheets

Ib : CONSTANT

FIG. 2(b)

Vg : CONSTANT

POWER CONVERSION APPARATUS AND ITS CONTROLLING METHOD

DETAILED DESCRIPTION OF THE INVENTION

This invention is related to a power conversion apparatus with a semiconductor device having a control terminal for controlling a main electric current and an insulated gate terminal for controlling an on-state voltage.

Voltage drive type semiconductor devices' such as MOSFETs and IGBTs can be turned on and off with a smaller power, compared with electric current drive type semiconductor devices' such as transistors and GTO thyristors. On this account, there are advantages in using such devices in that the power loss of the drive circuitry section can be reduced and the circuit configuration can be made simpler.

Because the switching speeds of the voltage drive type semiconductor devices at turn-off and turn-on are faster than those of the electric current drive type semiconductor devices, these voltage drive type devices are used in inverters and switching power sources for high frequency applications.

When MOSFETs and IGBTs are utilized as high voltage power conversion devices, the thickness of the low impurity concentration layer in the devices needs to be larger. As a result, the power loss of the devices increases with the on-state voltage.

A technique for reducing the size of the on-state voltage of MOSFETs and IGBTs is reported in Japanese patent laid-open print No. 3-23675 bulletin and Japanese patent laid-open print No. 5-283702 bulletin which disclose semiconductor devices having a charge injection layer.

Figure 11:
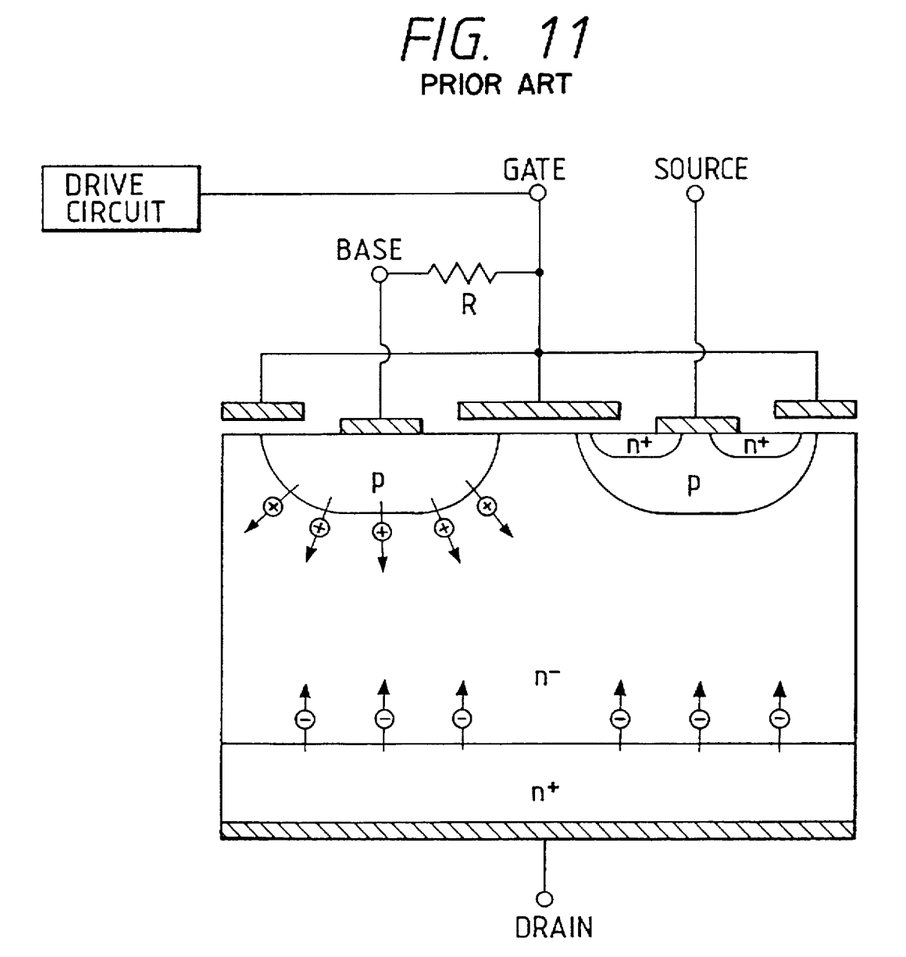
FIG. 11 is a diagram which shows a conventional MOSFET-TYPE semiconductor device having a charge injection layer.

FIG. 11 shows a conventional MOSFET-type semiconductor device having a charge injection layer (p-layer at the left-hand side of the drawing). An electrode Base (this electrode is hereinafter referred to as a base electrode) being in ohmic-contact with the charge injection layer is connected through resistance R to the insulated gate electrode Gate for controlling the main current. When the voltage is applied to the insulated gate electrode by means of a control circuit to turn on the device, current flows in the base electrode through resistor R. The on-state voltage of the semiconductor device can be controlled by this current. In other words, since holes are injected into an n⁻layer from the charge injection layer, conductivity modulation appears, and thus the on-state voltage can be reduced.

SUMMARY OF THE INVENTION

In conventional semiconductor devices having a charge injection layer, however, it is necessary to generate a sufficient conductivity modulation using a large current flow in the base electrode to achieve a lower on-state voltage. For this reason, since a control circuit which can supply a large current is necessary, the power loss of the control circuit increases.

Therefore, the total power loss of the power conversion apparatus can not be reduced.

The present invention aims at eliminating the above mentioned problems, and its object is reduction of the power loss of the power conversion apparatus having a semiconductor device.

In accordance with the present invention, a semiconductor device is used for a power conversion apparatus, in which the semiconductor device comprises a pair of main terminals, an insulated gate terminal and a control terminal for controlling an on-state voltage between the main terminals. The main terminals of the semiconductor device are connected to a load, thereby to control the main current flowing in the load.

Energy of the main current flowing in the load is stored in energy storage means and a control signal is supplied to the control terminal of the semiconductor device using the stored energy.

According to one aspect of the present invention, the control signal power is supplied from the stored energy in the main current circuit. Therefore, the supplying of power from the control circuit is not necessary. Consequently, the power loss generated in the semiconductor device can be reduced without a consequent increase in the power loss of the control circuit, so that the total power loss of the power conversion apparatus can be reduced.

DETAILED DESCRIPTION OF THE PREFERRED EMBODIMENTS

In the following description, various examples of the present invention will be explained with reference to the drawings.

Figure 1:
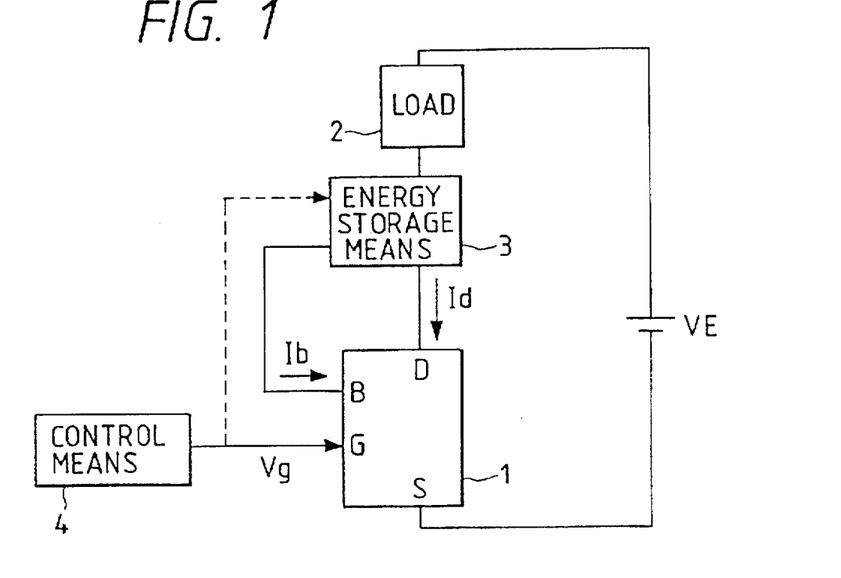
FIG. 1 is a diagram showing one example of a power conversion apparatus of the present invention.

FIG. 1 is a diagram showing a first example of the power conversion apparatus of the present invention. In FIG. 1, semiconductor device 1 is a four terminal semiconductor device having drain terminal (D) and source terminal (S), which are the main electrodes for input/ output of the main current, insulated gate terminal (G) for controlling the main current, and control terminal (B) for controlling the on-state voltage. This semiconductor device 1 is connected in a closed circuit with main power source VE through load 2 and energy storage means 3. Control voltage signal Vg (gate voltage) is applied to the gate terminal by control means 4, and a control current signal Ib (base current) is supplied from energy storage means 3.

Figure 2A:
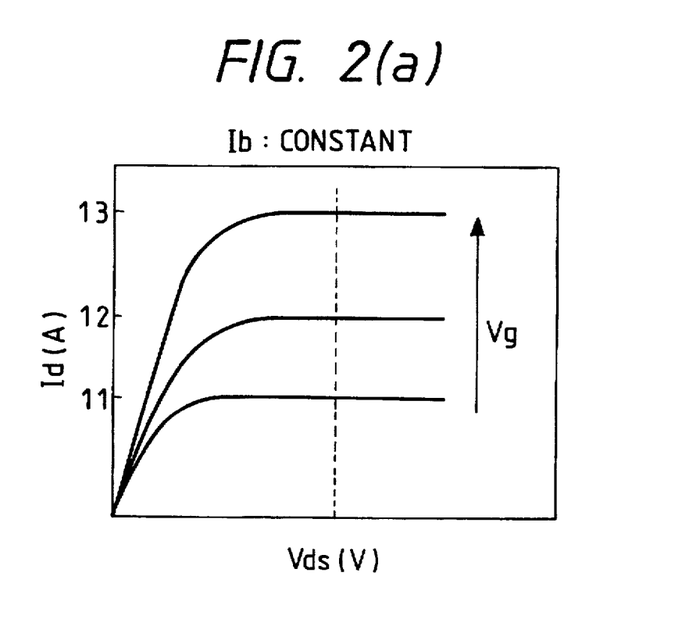
FIGS. 2(a) and 2(b) are graphs showing characteristics of the semiconductor device as used in the example of FIG. 1.
Figure 2B:
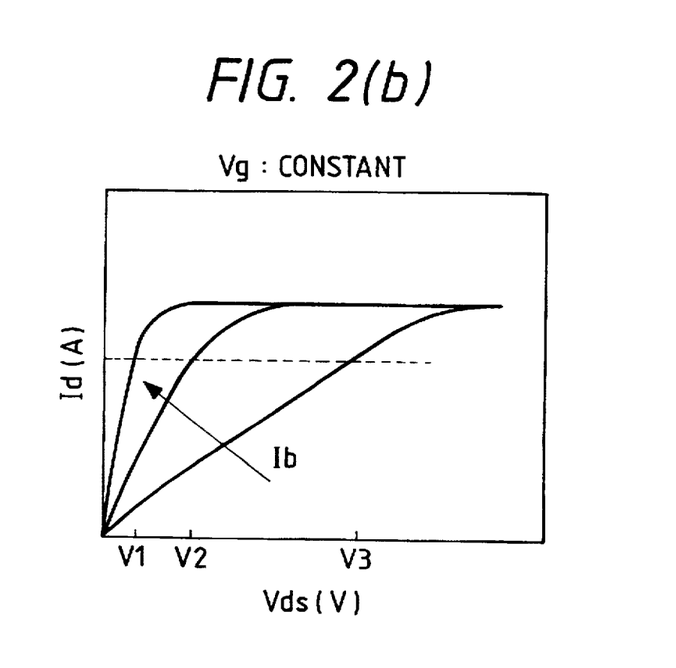

The base terminal of the four terminal semiconductor device in this example is connected to the charge injection layer' as shown in FIG. 11, and the device has characteristics as shown in FIG. 2(a) and FIG. 2(b). However, resistance means R' as shown in FIG. 11' is not connected to the base terminal.

FIG. 2(a) shows that when the voltage Vg between the gate terminal and the source terminal is controlled, the main current Id varies. FIG. 2(b) shows that when the base current Ib flowing in the base terminal is controlled, the on-state voltage of the element varies for a given main current Id.

The operation of the example of FIG. 1 will be explained as follows. When an on-signal (the voltage is 15V, for example) is input into the gate terminal of semiconductor device 1 from control means 4, main current Id begins to flow. By ON/OFF control of the gate voltage, main current flows intermittently. According to a change in the main current at this time, electric energy is stored in energy storage means 3. In this manner, the energy stored in the main current circuit is supplied the base current Ib to the base terminal of the semiconductor device 1 from the energy storage means 3. As a result, the on-state voltage of the semiconductor device 1 is reduced, according to the value of Ib as shown in FIG. 2(b). Accordingly, the power loss generated in the semiconductor device can be reduced without increasing the power loss in the control means 4.

The quantity of energy stored in energy storage means 3 and the base current derived therefrom varies with the value of the main current Id. In other words, the larger the main current is, the larger will be the stored energy the base current. Accordingly, the on-state voltage reduction effected by the base current is effective over the entire range of main current values so that the power loss decreases remarkably. A signal is applied to energy storage means 3 from control thee terminal 4 to control stored energy and base current. Furthermore, as for a connecting position of the energy storage means 3, the position is not limited to the one shown in FIG. 1, as long as it is located in the main circuit.

Figure 3:
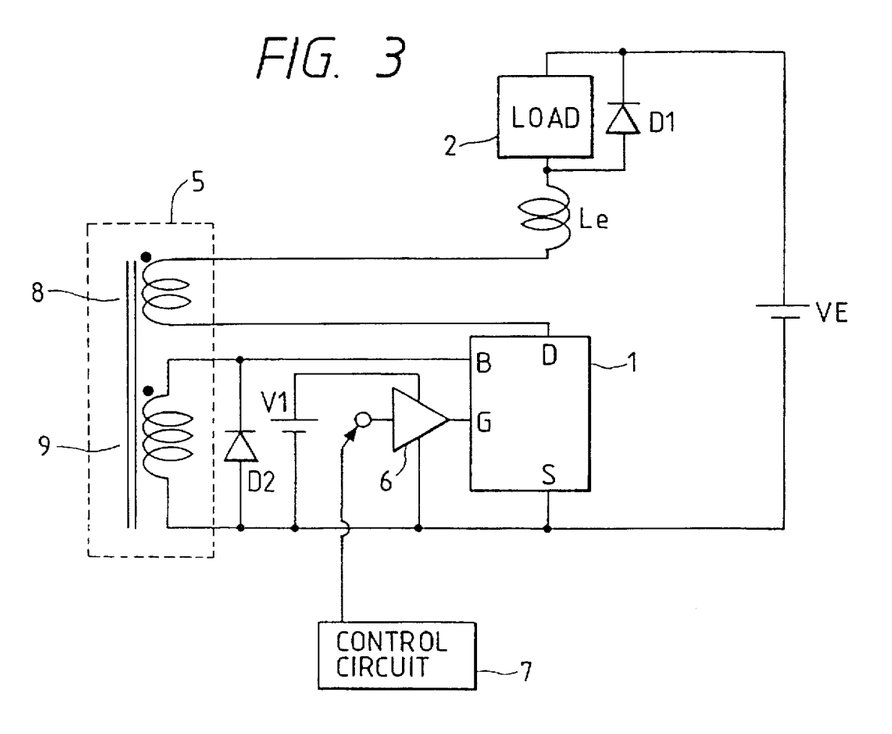
FIG. 3 is a schematic circuit diagram showing an example of a detailed circuit configuration of the apparatus of FIG. 1.

FIG. 3 shows an example of the details of the circuit shown in FIG. 1. In this example, load 2 is an inductive type load, and a free wheel diode D1 is connected to the load in reverse parallel connection. Inductance Le represents the inductance in the electric wiring. The area surrounded by the dotted line is a current transformer 5 which is equivalent to energy storage means 3 of a FIG. 1. Energy of the main current is stored as the energy of magnetic field.

Winding 8 represents a primary winding for exciting an iron core using the main current, and winding 9 represents a secondary winding. One end of secondary winding 9 is connected to a diode D2, thereby to supply current to the base terminal of the semiconductor device 1. Diode D2 is connected across the secondary winding a in such a manner that the cathode of the diode D2 is connected to the base terminal of the semiconductor device 1. The control means is composed of a gate drive circuit 6, a power supply V1 for the gate drive and a control circuit 7.

In response to a signal from control circuit 7, this circuitry operates as follows. Signals from the control circuit 7 are amplified in gate drive circuit 6, and then a gate voltage is supplied to the gate terminal of semiconductor device 1.

When the semiconductor device 1 is in the on-state, main current flows in the semiconductor device 1 through the load 2, the electric wiring inductance Le, and the primary winding 8 of the current transformer 5. As a result, in response to a change in the main current flowing in the primary winding 8 of the current transformer 5, a motive force is generated in the secondary winding 9. Then' current flows in the secondary winding 9 in proportion to the turn ratio of the primary/secondary windings. This current is supplied to the base terminal of the semiconductor device 1.

The on-state voltage of the semiconductor device 1 decreases when the base current is supplied from secondary winding 9. The extent of the decrease corresponds to the value of the main current. According to this example, although the circuit loss increases little with use of the connecting current transformer, the loss reduction effect in the semiconductor device 1 is superior. Thus, the total loss of the power conversion apparatus decreases remarkably and the efficiency of the apparatus improves.

Figure 4:
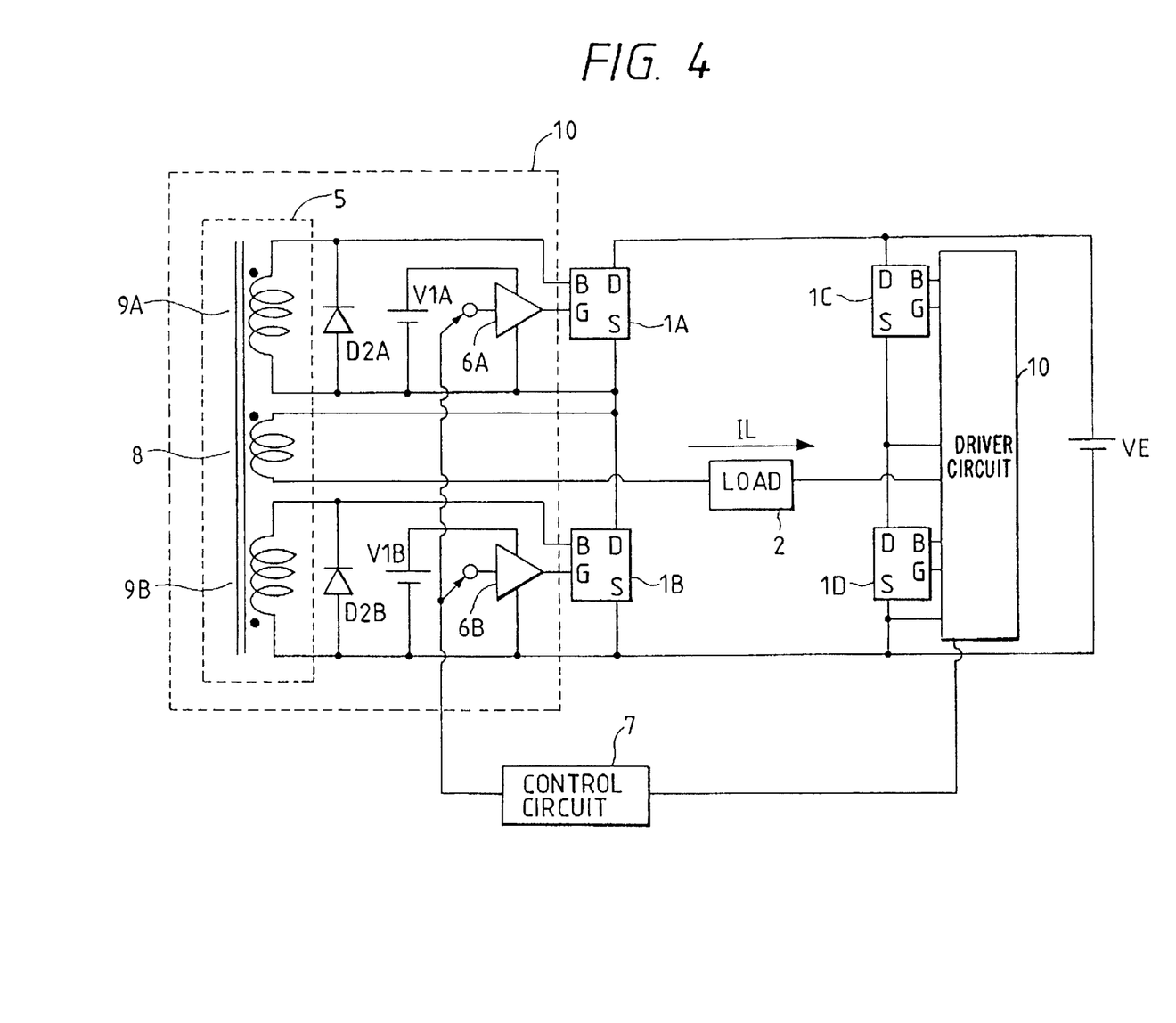
FIG. 4 is a schematic diagram showing an example of the power conversion apparatus for controlling alternating current wherein the circuit constitution of FIG. 3 was applied.

FIG. 4 shows an example of a power conversion apparatus, to which the circuit configuration shown in FIG. 3 is applied, for controlling an alternating current. The main circuit of this example constitutes a single phase inverter comprising four 4-terminal semiconductor devices 1A to 1D.

One current transformer 5 is disposed in each phase of the inverter. Drive means 10, which is disposed in the phase illustrated at the left hand side in FIG. 4, has semiconductor devices 1A and 1B as an upper arm and lower arm, respectively. To each arm, as also shown in FIG. 3, the gate drive circuit 6, the gate drive power supply V1, the secondary winding 9 of the current transformer and the diode D2 are connected. A symbol A is attached to the upper arm and a symbol B is attached to the lower arm. The difference from the example of FIG. 3 is that the primary winding 8 of the current transformer is disposed between the source terminal of the semiconductor 1A and the load 2. The secondary winding 9A of the upper arm has the same polarity as the primary winding 8, and secondary winding 9B of the lower arm has the opposite polarity to that. Though omitted in FIG. 4, the phase associated with the semiconductor devices 1C, 1D have a similar driving means 10.

When signals are input into semiconductor devices 1A, 1D from control circuit 7 through gate drive circuit 6, and OFF signals are input into semiconductor devices 1B, 1C. Load current IL flows in semiconductor device 1A, current transformer 5, load 2, and semiconductor device 1D. An electro-motive force is generated in the secondary winding 9 due to the change in the current flowing secondary winding 8 of the current transformer 5. Consequently, a base current in proportion to the main current IL is supplied to the base terminal of the semiconductor device 1A. Then, an electro-motive force in the reverse direction is induced in the secondary winding 9B. This current is returned by diode D2B. Accordingly, in the semiconductor device which is in the off state, no base current flows so that a loss due to a base current does not occur. Similarly, a base current is supplied to a semiconductor device 1D by the current transformer of the drive circuit 10.

Subsequently, on-signals are input into semiconductor device 1B and 1C, and off-signals are input into semiconductor device 1A and 1D the gate drive circuit from control circuit 7. Then, a load current IL flows in the semiconductor device 1C, the load 2 and the semiconductor device 1B. Current flows in the load 2 in an opposite direction. Additionally, a base current in proportion to IL is supplied to the semiconductor devices 1C, 1B.

As stated above, when the alternating current is controlled, a base current is supplied to the arms in accordance with the polarity of the main current. Furthermore, the quantity of the base current can be varied in proportion to the main current. Therefore, the efficiency of the whole apparatus can be increased in the same manner as the apparatus in FIG. 3.

Figure 5:
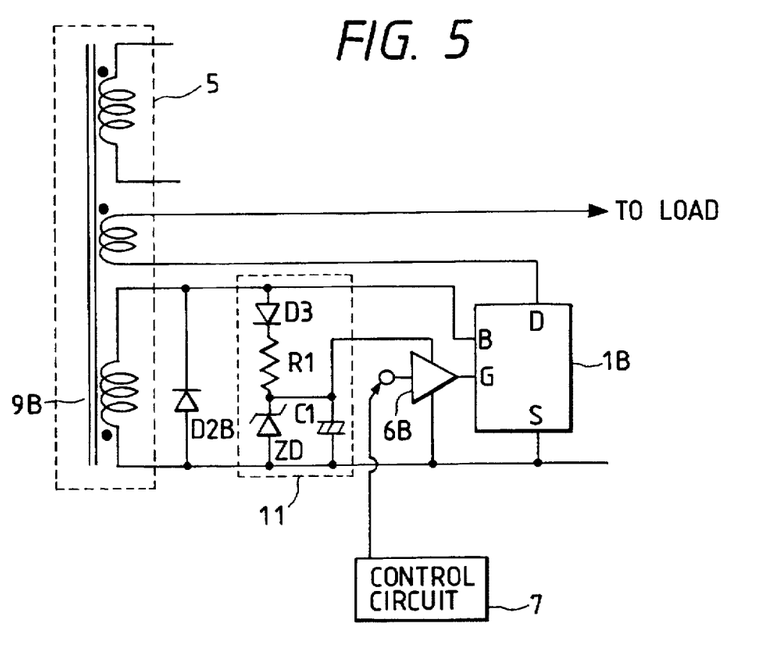
FIG. 5 is a schematic diagram showing an example which includes a circuit for supplying gate drive power in the example of FIG. 4.

FIG. 5 shows one example of a circuit for supplying gate drive power for supply V1 from the secondary winding of the current transformer in the example of FIG. 4. This drawing corresponds to a part of the power conversion apparatus shown in FIG. 4, and is featured by a self-supplying power source V1 for the gate drive circuit shown in FIGS. 3 and 4, through use of a circuit shown in area 11 surrounded by the dotted line. Area 11 is composed of a series circuit comprising diode D3, resistance R1 and zener diode ZD, and the ends of the series circuit are connected to respective ends of the secondary winding 9B, while the capacitor C1 is connected in parallel with the zener diode ZD.

In operation, when the semiconductor device 1B is in the on-state, power generated in the secondary winding 9B of the current transformer 5 is supplied to the capacitor C1 for the gate drive power source through the diode D3 and the resistance R1 to charge the capacitor.

Zener diode ZD controls the gate drive power supply voltage. Because the capacitor C1 is not charged before the load current IL flows, a start-up means for applying an initial voltage to the capacitor C1 is necessary, but this means is not shown in FIG. 5. Gate drive power source V1 shown in FIGS. 3 and 4 consumes a very small amount of current, because V1 drives the gate G. However, in case of an inverter as shown in FIG. 4, an insulated gate drive power supply is necessary for each arm. According to this circuit configuration, such insulated power supplies can be provided by a current transformer. Therefore, the size of the power conversion apparatus can be reduced.

Figure 6:
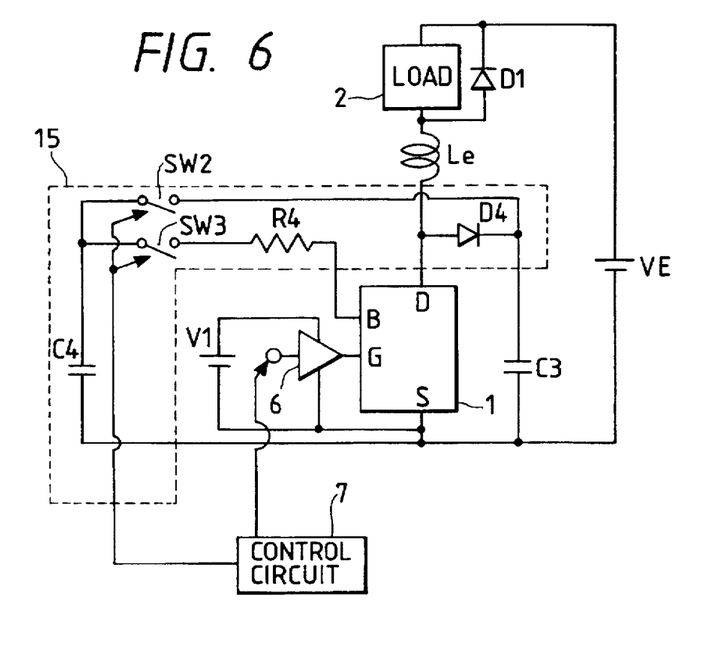
FIG. 6 a schematic diagram showing is one example in which a capacitor is used as energy storage means.

FIG. 6 is an example which utilizes a capacitor as energy storage means. In this example, the load 2 is inductive, and the free wheel diode D1 is connected thereto in reverse parallel connection. Inductance Le represents the inductance of the electric wiring. Control means for controlling the main current is constituted by the gate drive circuit 6, the gate drive power source V1 and the control circuit 7. A snabber circuit having a diode D4 and capacitor C3 is connected between the drain terminal and the source terminal of the semiconductor device 1.

This example is featured by transferring energy stored in the snabber capacitor C3 to a capacitor C4 for the base power source. The constituent elements in the area 15 surrounded by the dotted line will be explained. In the area 15, a switching means SW2 is disposed between a connecting point of the capacitor C3 and the diode D4 and one of the terminals of the capacitor C4. The other terminal of the capacitor C4 is connected to the source terminal of the semiconductor device 1.

Switching means SW3 is connected between a connecting point of the capacitor C4 and switching means SW2 and resistance R4, which is connected to the base terminal of the semiconductor device 1. Switching means SW2, SW3 are on/off controlled by control circuit 7. As for these switching means, semiconductor devices such as bipolar transistors or MOSFETs can be used. This example operates as follows. The snabber circuit including diode D4 and capacitor C3 is the same as that in general use. When semiconductor device 1 turns off, the capacitor C3 is charged by the main current, so that dV/dt between the drain terminal and the source terminal at the time of current shutdown is reduced. When the semiconductor device 1 is in the off-state, SW2 and SW3 remain in the off-state.

When a gate voltage is applied to the gate terminal of the semiconductor device 1 from the gate drive circuit 6 in response to the on-signal input from the control circuit to turn on the semiconductor device 1, main current flows in the semiconductor device 1 through the load 2 and the wiring inductance Le. The on-signal is applied to the switching means SW2, SW3 from the control circuit 7, so that both switches are turned on. As a result, energy stored in the capacitor C3 at the time of turn-on is transferred to the capacitor C4 through SW2 to charge the capacitor C4. At the same time, the capacitor C4 discharges electricity when switching means SW3 turns on, so that current is supplied to the base terminal of the semiconductor device 1 through resistance R4, thereby to reduce the on-state voltage of the semiconductor device.

According to this example, the loss of the semiconductor devices decreases, and because energy of the snabber capacitor for dV/dt restraint at current cutoff is used as energy for driving the base of the semiconductor device, it is possible to provide a power conversion apparatus with a high efficiency.

Figure 7:
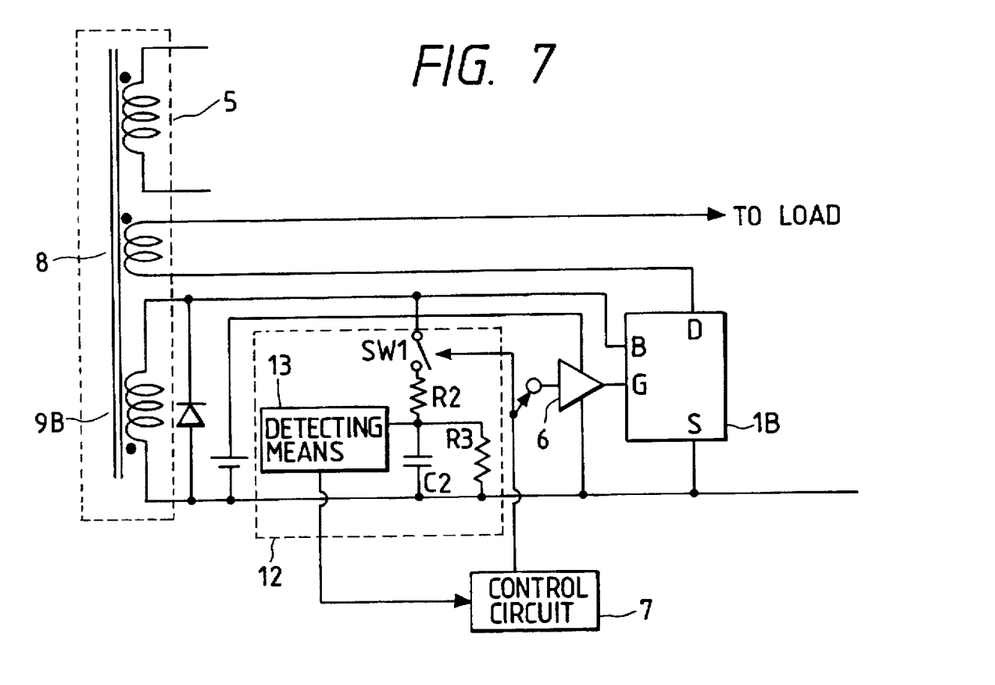
FIG. 7 is a schematic diagram showing an example of a power conversion apparatus which possesses protection function from over current.

FIG. 7 is an example of a power conversion apparatus of the present invention which possesses an overcurrent protection function. The driving circuit for the semiconductor device 1 is similar to the one shown in FIG. 4; here only a circuit for the semiconductor device 1B is shown. The circuit in area 12 surrounded by a dotted line is connected across both ends of the secondary winding 9B of the current transformer. Area 12 includes a series circuit including switching means SW1 and resistances R2, R3, and a capacitor C2 is connected in parallel with resistance R3. This circuitry is used for charging the capacitor C2. Here, a voltage across the capacitor C2 is detected by detecting means 13. As voltage detecting means, a differential amplifier can be used. In the following, the operation of this example will be explained. Supposing that the load is short circuited, the main current flowing in the semiconductor device 1 shown in FIG. 2(a) will be a maximum value in proportion to the applied gate voltage. Therefore, the load current will be restricted by this value, and a voltage which is the same as the main power source will be applied between the drain and source electrodes. As a result, the p-n junction, consisting of a n⁻layer and a charge injection layer, as seen in FIG. 11, becomes in a reverse bias state, so that that base current will not flow until the short-circuit is eliminated.

On the other hand, the primary winding 8 of the current transformer 5 is excited by the load current, and the current supplying capacity of secondary winding 9B is maintained. During the on-state of the semiconductor device 1, when the switching means SW1 is kept ON by the control circuit 7, almost all of current of the secondary winding is supplied to the base electrode, but not to the capacitor C2 at the time of a normal state, so that the voltage of the capacitor C2 is kept low.

When a short-circuit occurs, the current of the secondary winding does not flow in the semiconductor device because of the reverse bias, but it charges the capacitor C2 through switching means SW1, thereby to increase the voltage of the capacitor C2.

When the voltage of the capacitor C2 detected by detection means 13, is higher than a predetermined level, such a state is regarded as indicative of a short circuit. Then, a signal indicating an abnormality is given to the control circuit 7, which applies an off signal to the gate drive circuit 6, thereby to turn off the semiconductor device 1. In this way, as seen in this example, the base current is converted into a voltage and is detected. Based on this result, an over-current state of the 4 terminal semiconductor device can be detected.

In the case of this example, because an over-current is not detected from a load current circuitry of high voltage, unlike the conventional technique, and because a current detection means is installed in the vicinity of the circuitry of low voltage, the power conversion apparatus is little affected by noise and protection of the apparatus from an over-current is made highly reliable. The base current can be directly detected without converting it to a voltage. In this case, an over-current state is detected from a value and its variation of the base current.

Figure 8:
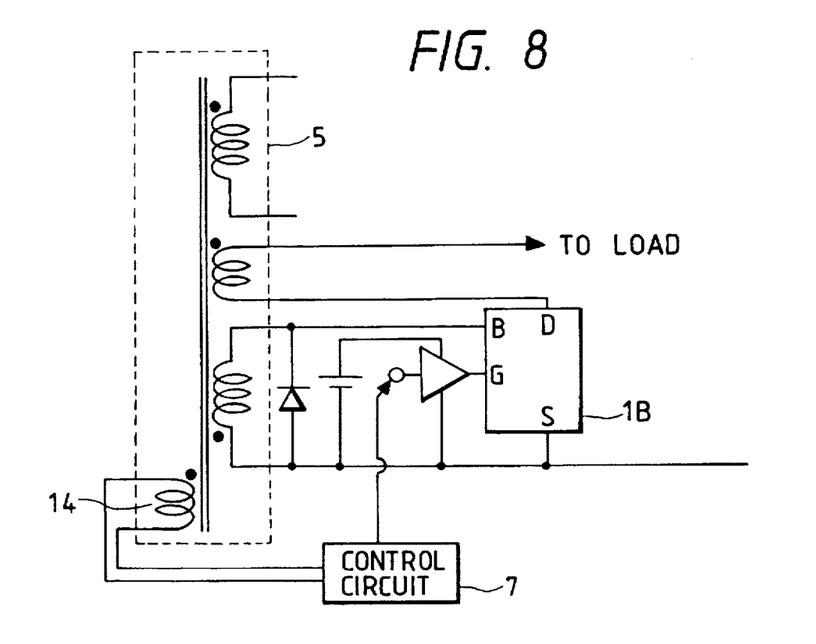
FIG. 8 is a schematic diagram showing an example wherein a load current is detected with a current transformer as an application example of FIG. 4.

In FIG. 8, an application of the arrangement shown in FIG. 4 is shown. In this example, the current transformer 5 is used to detect the load current. The drive means of the semiconductor device 1 is the same as the one shown in FIG. 4.

In the present example, a winding 14 (tertiary winding) for detecting current is installed at the secondary winding of current transformer 5, and is used as a winding for detecting base current. The output of this winding 14 is fed back to the control circuit 7. In conventional inverters, current transformers are used only to detect load current, but in the present invention, the single current transformer can be utilized as a means for supplying base current and for detecting current so that the size of the apparatus of this invention can be reduced along with its cost.

Figure 9:
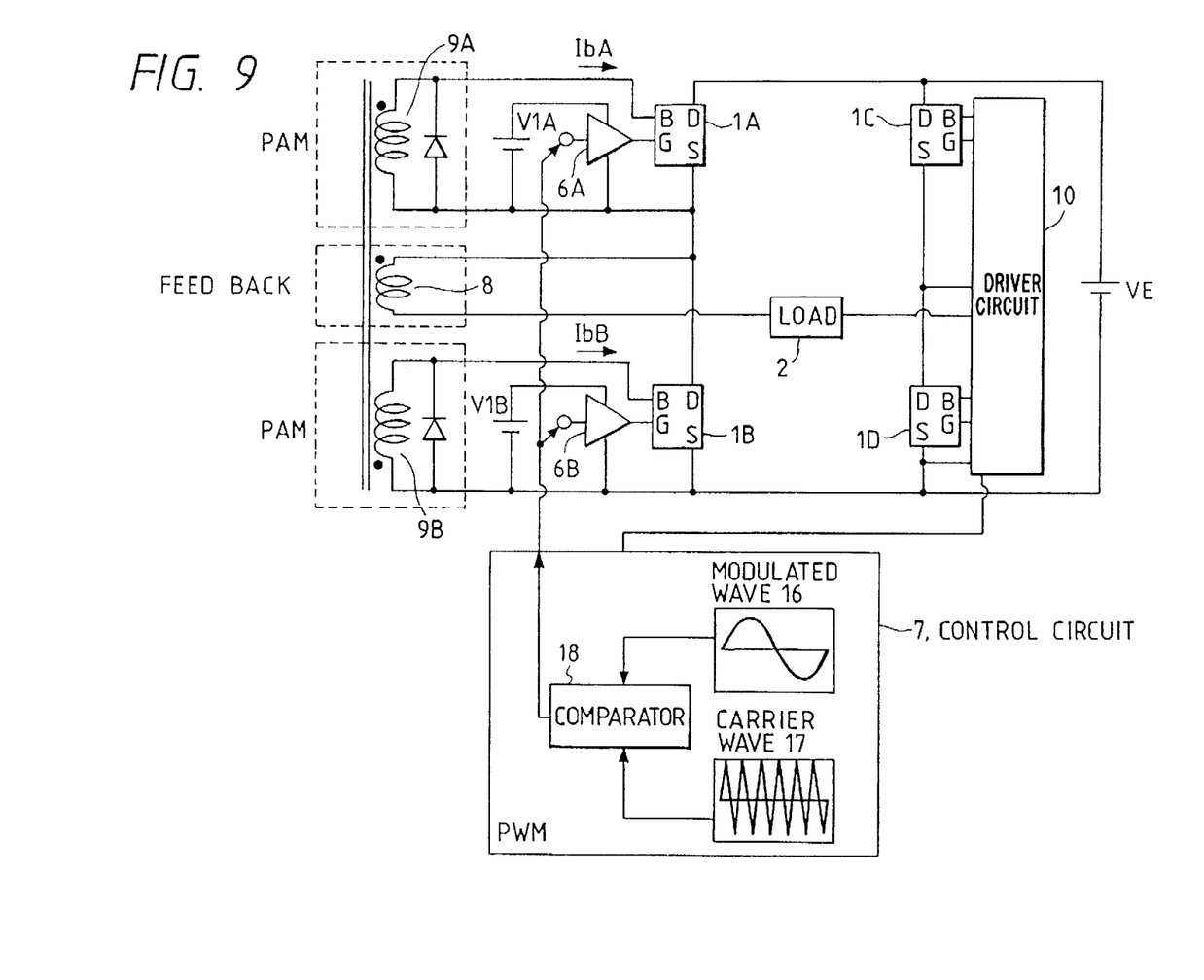
FIG. 9 is a schematic diagram showing one example of a control method of the power conversion apparatus of the present invention.

FIG. 9 shows an example of a power conversion apparatus of the present invention including details of the control circuit 7. The structure of the power conversion apparatus shown in FIG. 9 is the same as FIG. 4. At first, the control circuit 7 compares modulated wave 16 corresponding to the load current with carrier wave 17, as shown in the drawing.

When the magnitude of the modulated wave 16 is larger than that of the carrier wave 17, the upper arm is turned on and the lower arm is turned off by pulse width modulation (PWM modulation). When the magnitude of the modulated wave is smaller than that of the carrier wave, the upper arm is turned off and the lower arm is turned on by pulse width modulation. According to PWM modulation, the frequency of the load current becomes equal to that of the modulated wave, and its magnitude becomes proportional to that of the modulated wave. The PWM modulation is a common controlling method for an inverter that has a conventional three terminal semiconductor. In this example, the load current is supplied to a primary winding 8 of the current transformer. An output current that has a magnitude proportional to the load current and has a polarity changing in accordance with the load current can be supplied by means of secondary windings 9A, 9B that are electro magnetically connected to primary winding 8. When output current from windings 9A, 9B flows to semiconductor devices 1A, 1B, the on-state voltages of the devices vary in accordance with the characteristics shown in FIG. 2(b).

Figure 10:
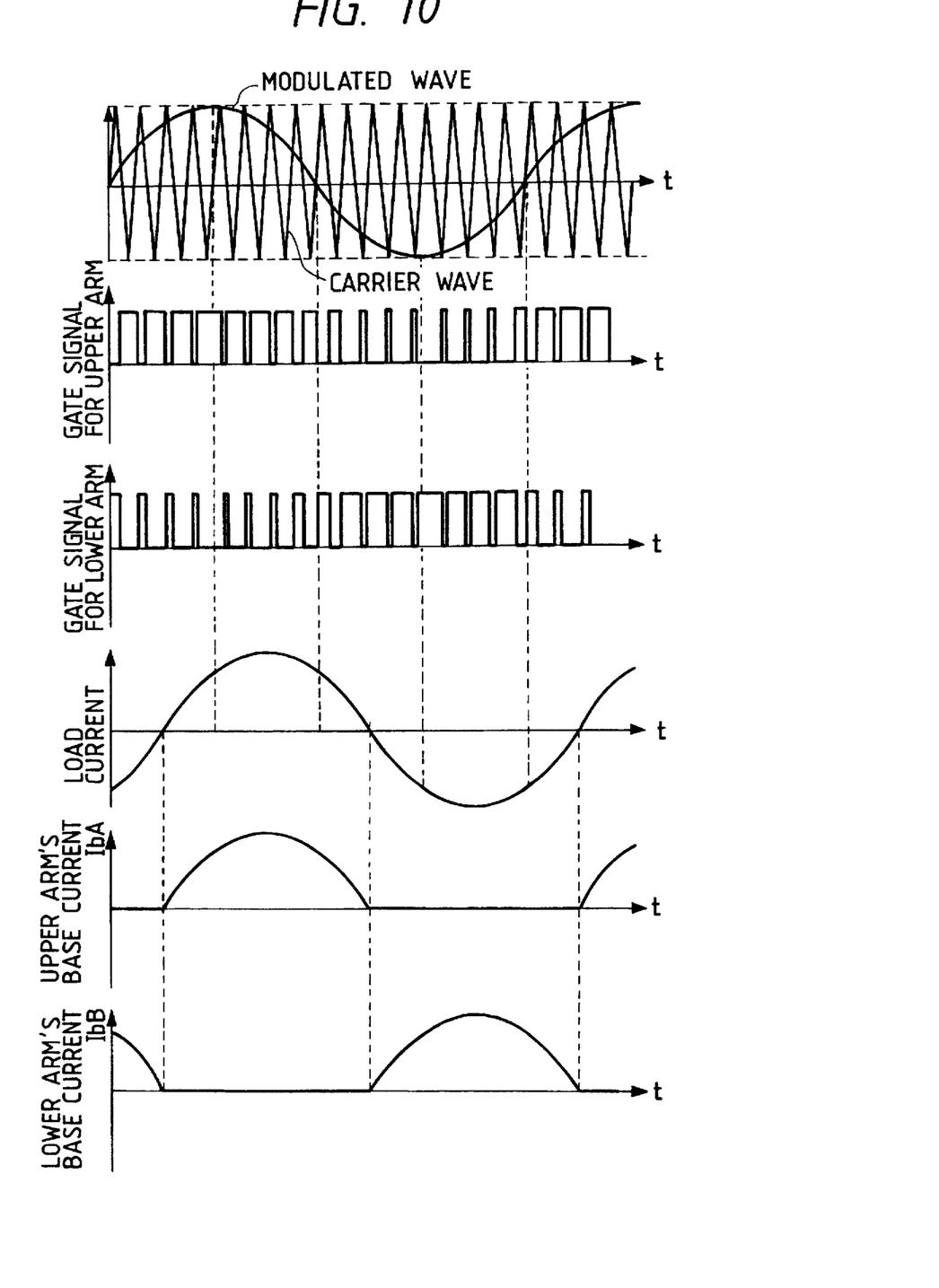
FIG. 10 is a waveform diagram which shows operation waveforms of the respective sections of the example of FIG. 9.

A driving wave form of each section of FIG. 9 is shown in FIG. 10. Signal pulses which are supplied to the gate terminals of the semiconductor devices 1A and 1B becomes pulses with PWM modulation.

On the other hand, half sine waves of the base currents IbA and IbB are supplied to base terminals 1A and 1B. This base current is supplied only to the arm where load current flows, as in the example of FIG. 4. In the semiconductor device in which load current does not flow, a loss due to a base current does not occur. In the control method of this example, the base current is magnitude-modulated into a sine wave form according to the load current.

If the load is inductive, phase of the load current is delayed with respect to the modulated current wave 16. Therefore, a detecting means to detect the phase of the load current is necessary. In the present invention, the primary winding of the current transformer serves as the detecting means, and at the same time, it supplies energy for driving the base from the secondary winding through the iron core. As a result, an ideal PAM, which is free from phase delay due to a base current of the semiconductor devices 1A, 1B, is possible. By this PAM, the larger the load current of semiconductor devices 1A, 1B is, the smaller will be the on-state voltage.

Although the same current transformer operates as both an energy coupling means and a PAM means in this example, these means can be different circuits from each other. For example, the power source means for supplying base current may have the structure as shown in FIG. 6, and the base current supplied from the power source can be changed in accordance with the load current.

In the example shown in FIG. 6, the switch SW3 can be an analogue switch, such as a variable resistor. The resistance value of this variable resistor SW3 can be varied in accordance with signals provided by the control circuit.

The four terminal semiconductor devices used in the above mentioned examples may take the form of any type of device between IGBTs, MOS thyristors, SIT thyristors, SI thyristors, etc., in addition to charge injection type MOSFETs. As for the energy storage means, secondary batteries can operate similarly as the current transformers or capacitors.

According to the present invention, the total power loss of the power conversion apparatus, including the control circuit, can be reduced. Furthermore, because the semiconductor device is driven by a control circuit of small power, the frequency of the power conversion apparatus and the speedup of its operation can be increased.

What is claimed is:

1. A power conversion apparatus which by switching a semiconductor device converts direct current power into alternating current power, comprising:

the semiconductor device having a pair of main terminals, an insulated gate terminal for controlling current flowing between the main terminals, and a control terminal into which a signal current for controlling an on-state voltage between the main terminals flows;

wherein one of the main terminals is connected to a load through energy storage means that stores energy derived from current flowing through the load;

wherein the signal current is supplied to the control terminal of the semiconductor device using the energy stored in the energy storage means, and wherein the control terminal is connected to a charge injection layer in the semiconductor device.

2. A power conversion apparatus which by switching a semiconductor device converts direct current power into alternating current power, comprising:

the semiconductor device having a pair of main terminals, an insulated gate terminal for controlling current flowing between the main terminals, and a control terminal into which a signal current for controlling an on-state voltage between the main terminals flows; and a transformer having a first winding connected between a load and one of the main terminals of the semiconductor device, and a second winding connected between the control terminal of the semiconductor device and the other main terminal;

wherein the control terminal is connected to a charge injection layer in the semiconductor device; and wherein a circuit applies a magnitude modulation to the signal current flowing into control terminal, the magnitude modulation corresponding to a magnitude of the alternating current power.

3. A control method for converting direct current power into alternating current power by switching a semiconductor device, wherein the semiconductor comprises a pair of main terminals, an insulated gate terminal for controlling current flowing between the main terminals and a control terminal in which a signal current for controlling an on-voltage between the main terminals flows, which method comprises the steps of applying pulse width modulation to a signal voltage to be supplied to the gate terminal, and applying a magnitude modulation to the signal current supplied to the control terminal, wherein the magnitude modulation corresponds to a magnitude of an alternating current, and wherein said control terminal is connected to a charge injection layer in the semiconductor device.

4. A power conversion apparatus according to claim 1, further comprising:

a control circuit which inputs a voltage signal into said insulated gate terminal to control the current flowing between said main terminals.

5. A power conversion apparatus according to claim 1, wherein the control terminal and the insulated gate terminal are different terminals.

6. A power conversion apparatus according to claim 1, wherein the signal current reduces a magnitude of the on-state voltage to a level sufficient to reduce power losses in the apparatus.

7. A power conversion apparatus according to claim 1, further comprising:

a circuit which applies a magnitude modulation to the signal current flowing into the control terminal, the magnitude modulation corresponding to a magnitude of the alternating current power.

8. A power conversion apparatus according to claim 2, further comprising:

a control circuit which inputs a voltage signal into the insulated gate terminal to control the current flowing between the main terminals.

9. A power conversion apparatus according to claim 2, wherein the control terminal and the insulated gate terminal are different terminals.

10. A power conversion apparatus according to claim 2, wherein the signal current reduces a magnitude of the on-state voltage to a level sufficient to reduce power losses in the apparatus.

* * * * *